United States Patent
Chou

(10) Patent No.: US 9,929,019 B2
(45) Date of Patent: Mar. 27, 2018

(54) PATTERNS FORMING METHOD

(71) Applicant: Micron Technology, Inc., Boise, ID (US)

(72) Inventor: Kuo-Yao Chou, Taichung (TW)

(73) Assignee: Micron Technology, Inc., Boise, ID (US)

(*) Notice: Subject to any disclaimer, the term of this patent is extended or adjusted under 35 U.S.C. 154(b) by 8 days.

(21) Appl. No.: 15/093,734

(22) Filed: Apr. 7, 2016

(65) Prior Publication Data

US 2017/0294317 A1 Oct. 12, 2017

(51) Int. Cl.
*H01L 21/30* (2006.01)
*H01L 21/308* (2006.01)
*H01L 21/027* (2006.01)

(52) U.S. Cl.
CPC ...... *H01L 21/3086* (2013.01); *H01L 21/0274* (2013.01); *H01L 21/3081* (2013.01)

(58) Field of Classification Search
CPC ............. H01L 21/3086; H01L 21/0274; H01L 21/3081
See application file for complete search history.

(56) References Cited

U.S. PATENT DOCUMENTS

| | | |
|---|---|---|
| 2006/0189122 A1 | 8/2006 | Schroeder |
| 2014/0030894 A1 | 1/2014 | Shin |
| 2015/0270141 A1* | 9/2015 | Chou ............... H01L 21/31144 438/694 |
| 2015/0380266 A1* | 12/2015 | Wuister ............... G03F 7/0002 257/622 |

FOREIGN PATENT DOCUMENTS

TW 201511083 A 3/2015

OTHER PUBLICATIONS

Taiwanese Office Action (dated Jun. 7, 2017) and Search Report (dated Jun. 5, 2017) for Taiwanese Application No. 105128508, 10 pages.
Definition of Fill, Merriam-Webster Dictionary, https://www.merriam-webster.com/dictionary/fill, page last visited Aug. 28, 2017, 1 page.

* cited by examiner

*Primary Examiner* — Whitney T Moore
*Assistant Examiner* — Joseph Galvin, III
(74) *Attorney, Agent, or Firm* — TraskBritt

(57) ABSTRACT

A patterns forming method begins with performing a lithography process on a photoresist film with a photomask having first apertures in a first mask region and second apertures in a second mask region to respectively form first main features and dummy features, on which the second mask region is located between the border of the photomask and the first mask region, and a size of each of the first apertures is greater than a size of each of the second apertures. Subsequently, a material is filled into the first main features to respectively form second main features and into the dummy features to seal the dummy features. Then, a substrate is etched to form patterned features by using the photoresist film having the second main features.

17 Claims, 6 Drawing Sheets

Fig. 7

PATTERNS FORMING METHOD

TECHNICAL FIELD

The present disclosure relates to a patterns forming method. More particularly, the present disclosure relates to forming uniformly patterned features on a semiconductor workpiece.

BACKGROUND

Conventional patterns forming method produces patterned features with scattering minimum feature sizes (CD) on a semiconductor workpiece, especially on the marginal area of a semiconductor workpiece. The uniformity of the minimum feature sizes of the patterned features may influence the electrical properties of the semiconductor workpiece, such as resistance, or impedance and so on. For example, a semiconductor workpiece on which patterned features with scattering minimum feature sizes are formed may hardly execute an impedance matching process to eliminate the white noise or other noise. That is, the scattering minimum feature sizes of the patterned features may induce the adjustment of an impedance matching process being ineffective.

As aforementioned, the patterns forming method on a semiconductor workpiece apparently includes problems of inconvenience and defects, and needs further improvement. To address the problems, the ordinarily skilled artisans have been striving to attain a solution, but still have not developed a suitable solution. Therefore, it is important to effectively deal with the problems in the art.

BRIEF SUMMARY

The present disclosure provides a patterns forming method. The patterns forming method begins with performing a lithography process on a photoresist film with a photomask having first apertures in a first mask region and second apertures in a second mask region to respectively form first main features and dummy features, on which the second mask region is located between the border of the photomask and the first mask region, and a size of each of the first apertures is greater than a size of each of the second apertures. Subsequently, a material is filled into the first main features to respectively form second main features and into the dummy features to seal the dummy features. Then, a substrate is etched to form patterned features by using the photoresist film having the second main features.

According to an embodiment of the present disclosure, the filling of the material includes forming the material to fill the first main features and the dummy features of the photoresist film, and removing the material to form the second main features within the first main features.

According to an embodiment of the present disclosure, the removing of the material includes partially removing the material to make a through hole within each of the first main features while the dummy features are still sealed by the material, wherein the second main features are defined by the through holes.

According to an embodiment of the present disclosure, the performing of the lithography process on a photoresist film with the photomask includes exposing the photoresist film through the photomask, and forming the first main features and the dummy features by removing areas of the photoresist film exposed under the first apertures and the second apertures, respectively.

According to an embodiment of the present disclosure, the exposing of the photoresist film through the photomask includes providing an exposure light having a central region, in which one or more rows of the second apertures is located between the border of the central region and the first apertures.

According to an embodiment of the present disclosure, the patterns forming method further includes forming a hard mask between the substrate and the photoresist film.

According to an embodiment of the present disclosure, the etching of the substrate further includes etching the hard mask through the second main features to form third main features, and etching the substrate through the third main features.

According to an embodiment of the present disclosure, the first mask region is surrounded by the second mask region.

According to an embodiment of the present disclosure, the first apertures and the second apertures have similar geometry.

According to an embodiment of the present disclosure, the patterns forming method further includes forming the first apertures and the second apertures in a single process.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

Corresponding numerals and symbols in the different figures generally refer to corresponding parts unless other-

DETAILED DESCRIPTION

Figure 1:
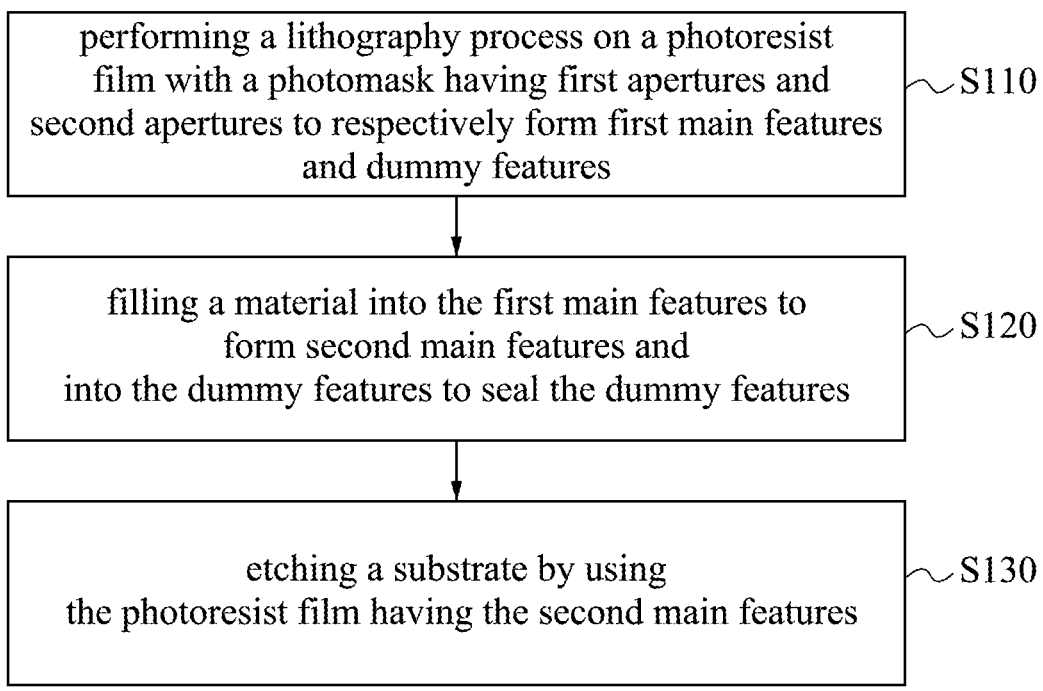
FIG. 1 is a flowchart of a patterns forming method according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

It will be understood that when an element is referred to as being "on" another element, it can be directly on the other element or intervening elements may be present therebetween. In contrast, when an element is referred to as being "directly on" another element, there are no intervening elements present.

FIG. 1 illustrates a flowchart of a patterns forming method 100 according to some embodiments. As shown in FIG. 1, the patterns forming method 100 begins with step S110 in which a lithography process is performed on a photoresist film with a photomask having first apertures in a first mask region and second apertures in a second mask region to respectively form first main features and dummy features. The second mask region is located between the border of the photomask and the first mask region. Namely, the second apertures are formed between the border of the photomask and the first apertures. In some embodiments, a size of each of the first apertures is greater than a size of each of the second apertures, which can generate first main features with a greater size compared to the dummy features on the photomask. Subsequently, the patterns forming method 100 continues with step S120 in which a material is filled into the first main features to form second main features, and filling the material into the dummy features to seal the dummy features. Then, the patterns forming method 100 continues with step S130 in which a substrate is etched by using the photoresist film having the second main features.

Owing to the second apertures assisting the first apertures to form the first main features uniformly under the lithography process and, moreover, the dummy features, formed by the second apertures, can be sealed to avoid further being transferred, the patterns forming method 100 is enabled to form the second main features, with a better uniformity, within the first main features. The second main features can be used for subsequent processes, such as an etching process, to transfer the second main features onto the underlying layers of a semiconductor workpiece. For example, the underlying layers may include a substrate or a hard mask layer. Owing to the uniformity of the second main features, the second main features can also generate patterned features with uniform minimum feature sizes (CD) in the underlying layers. That is to say, the patterns forming method 100 employs the photomask with the second apertures between the first apertures and the border of the photomask, to produce a semiconductor workpiece on which patterned features with uniform minimum feature sizes are formed. While avoiding or preventing the photoresist and underlying layers formed with features with scattering sizes, especially to regions proximal to the border of the photoresist and underlying layers, the semiconductor workpiece formed by the patterns forming method 100 may acquire better electrical properties. For example, the semiconductor workpiece can execute an impedance matching process more easily to eliminate the noise.

In addition, owing to the marginal effect of the lithography process, which may further enhance the difference of sizes between the uniform first main features and the dummy features, the dummy features can be filled or eliminated more easily. As a consequence, a size of the second main features can be adjusted to actual demand by varying the difference of sizes between the first main features and the dummy features. On the other hand, adjusting a ratio between the size of the first apertures and the size of the second apertures could vary the size of the second main features to fulfill actual demand.

Figure 2A:
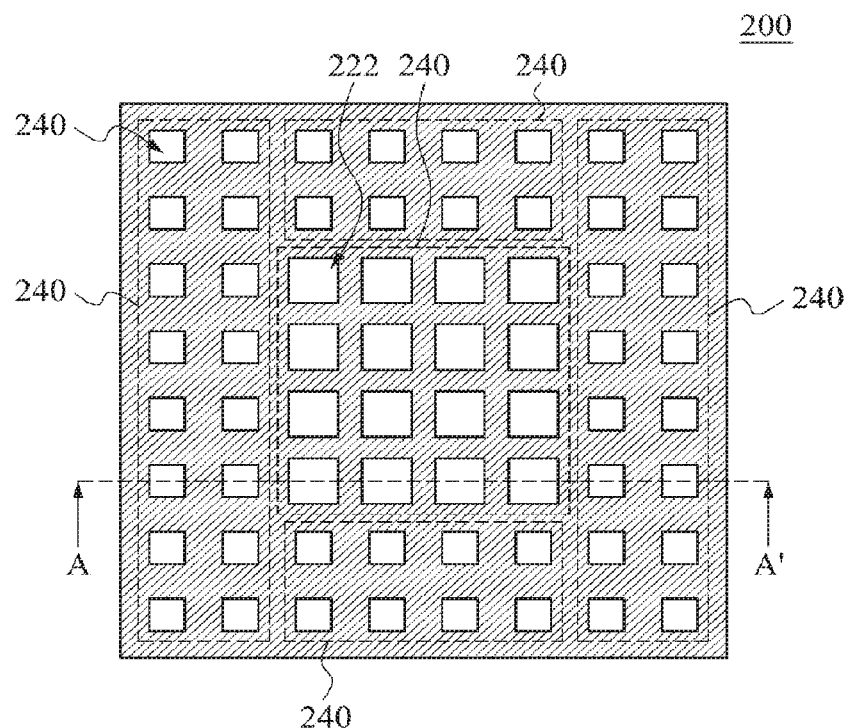
FIG. 2A is a top view schematic of a photomask according to some embodiments of the present disclosure.
Figure 2B:
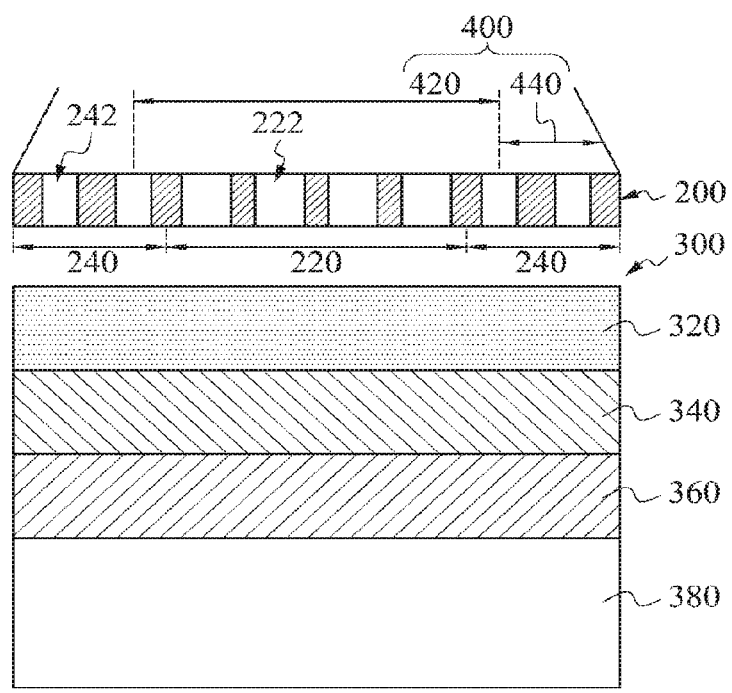
FIG. 2B is a cross-sectional view of a semiconductor workpiece and a photomask at a stage of a patterns forming method according to some embodiments of the present disclosure.
Figure 3A:
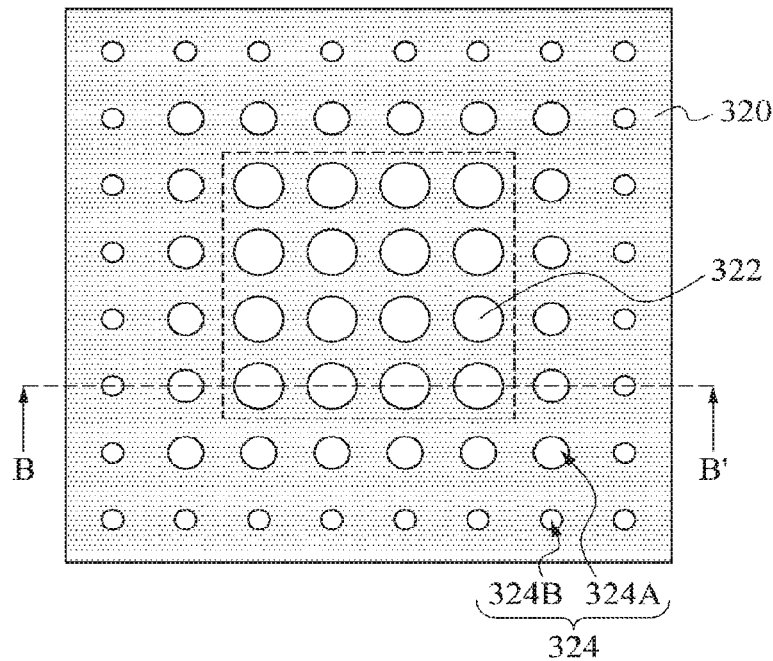
FIG. 3A is a top view schematic of a semiconductor workpiece according to some embodiments of the present disclosure.
Figure 3B:
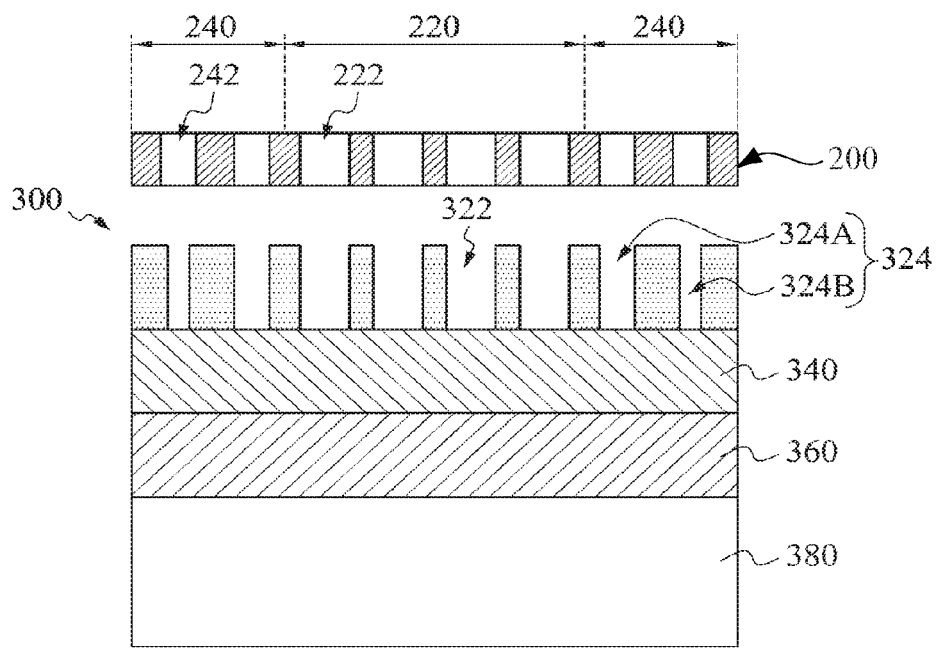
FIG. 3B is a cross-sectional view of a semiconductor workpiece at a stage of a patterns forming method according to some embodiments of the present disclosure.

FIG. 2A illustrates a top view schematic of a photomask 200 according to some embodiments. FIG. 2B illustrates a cross-sectional view of a semiconductor workpiece 300 and a photomask 200 at a stage of a patterns forming method 100 according to some embodiments. As shown in FIG. 2A, in some embodiments, the photomask 200 has a first mask region 220 on which first apertures 222 are formed, and a second mask region 240 on which second apertures 242 are formed. The second mask region 240 is located between the border of the photomask 200 and the first mask region 220. In some embodiments, the first mask region 220 can be surrounded by the second mask region 240, such that the first main features 322 (as shown in FIG. 3A, 3B) correspondingly formed by the first mask region 220 can be formed uniformly in every directions.

In some embodiments, the first apertures 222 and the second apertures 242 of the photomask 200 may have similar geometry. The first apertures 222 and the second apertures 242 can be square, rectangle, circle, ellipse, or other suitable shape. In some embodiments, the first apertures 222 and the second apertures 242 can be formed in a single process, to save processing time and photomasks used to fabricate the photomask 200. In other embodiments, the first apertures 222 and the second apertures 242 can be formed separately.

It should be noted that, the geometry properties of the first apertures 222 and the second apertures 242, described herein, such as shape, or density . . . etc., is only exemplary, not intended to limit the present disclosure. For example, if the geometry of the first apertures 222 and the second apertures 242 are circles, the size of the first apertures 222 and the second apertures 242 can be measured by diameters. For another example, if the geometry of the first apertures 222 and the second apertures 242 are squares, the size of the first apertures 222 and the second apertures 242 can be measured by radius, area, or perimeter . . . , etc. On the other hand, the size of the first apertures 222 and the second apertures 242 can be measured by sectional area. It should be understood that, the geometry properties of the first apertures 222 and the second apertures 242 could be adjusted to actual demand by those skilled in the art, without departing from the scope of the present disclosure. The prerequisite of the first apertures 222 and the second apertures 242 is that the second apertures 242 have a smaller size compared to the first apertures 222, and can assist the first apertures 222 to form the first main features 322 uniformly on a photoresist film 320 (as shown in FIG. 3A).

Referring to the FIG. 2B, the photomask 200, shown in FIG. 2B, can be regarded as a cross-sectional view of the photomask 200 taken along line A-A' in FIG. 2A. In some embodiments, the photomask 200 is adopted to perform a lithography process on a photoresist film 320 of the semiconductor workpiece 300. In some embodiments, the performing of the lithography process may include exposing the photoresist film 320 through the photomask 200. An exposure light 400 may be provided to perform the exposing of the photoresist film 320. In some embodiments, the exposure light 400 has a light field substantially divided into a central region 420 and a marginal region 440. In some embodiments, one or more rows of the second apertures 242 are located between the border of the central region 420 and the first apertures 222. Therefore, the second apertures 242 can function to assist the first apertures 222 in forming the first main features 322. In some embodiments, the first main features 322 are defined as the areas of the photoresist film 320 exposed through the first apertures 222 (as shown in FIG. 3B) under the central region 420 of the exposure light 400. In other embodiments, a light field of an exposure light 400 may be a flat field or other suitable shape of the light field. Regardless of the shape of the light field, one or more rows of the second apertures 242 need to be located between the border of the exposure light 400 and the first apertures 222.

FIG. 3A illustrates a top view schematic of a semiconductor workpiece 300 according to some embodiments. FIG. 3B illustrates a cross-sectional view of a semiconductor workpiece 300 and a photomask 200 at a stage of a patterns forming method 100 according to some embodiments of the present disclosure, in which the photoresist film 320, shown in FIG. 3B, can be regarded as a cross-sectional view of the photoresist film 320 taken along line B-B' in FIG. 3A. Referring to FIG. 3A and FIG. 3B, the first main features 322 and dummy features 324A, 324B, collectively referred to herein as 324, are formed on the photoresist film 320. In some embodiments, areas of the photoresist film 320 exposed under the first apertures 222 and the second apertures 242 are removed by developer, to form the first main features 322 and the dummy features 324, respectively.

Owing to the second apertures 242 assisting the first apertures 222 in forming the first main features 322, as shown in FIG. 3A and FIG. 3B, the geometry properties of the first main features 322 are substantially the same. Therefore, the first main features 322 of the photoresist film 320 can have a better uniformity while applying the photomask 200 with the first apertures 222 and the second apertures 242 to perform lithography processes on the photoresist film 320, to avoid or prevent the size of each of the first main features 322 on the photoresist film 320 from being scattering, which may form the uniform second main features subsequently.

Figure 4:
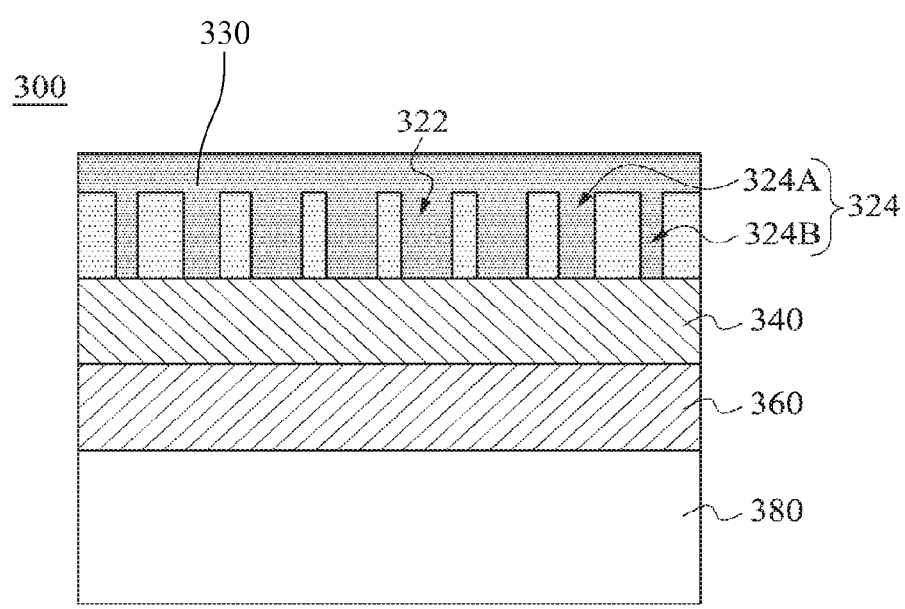
FIG. 4 is a cross-sectional view of a semiconductor workpiece at a stage of a patterns forming method according to some embodiments of the present disclosure.

FIG. 4 illustrates a cross-sectional view of a semiconductor workpiece 300 at a stage of a patterns forming method 100 according to some embodiments of the present disclosure. As shown in FIG. 4, in some embodiments, a material 330 is formed to substantially fill up the first main features 322 and the dummy features 324 of the photoresist film 320. In other embodiments, the material 330 can be formed to substantially fully cover or block the first main features 322 and the dummy features 324. In some embodiments, the material 330 can be a water-based material, or an organic-based material. In some embodiments, the material 330 can be a resolution enhancement lithography assisted by chemical shrink (RELACS) material, a thermal material, or other suitable materials.

Figure 5A:
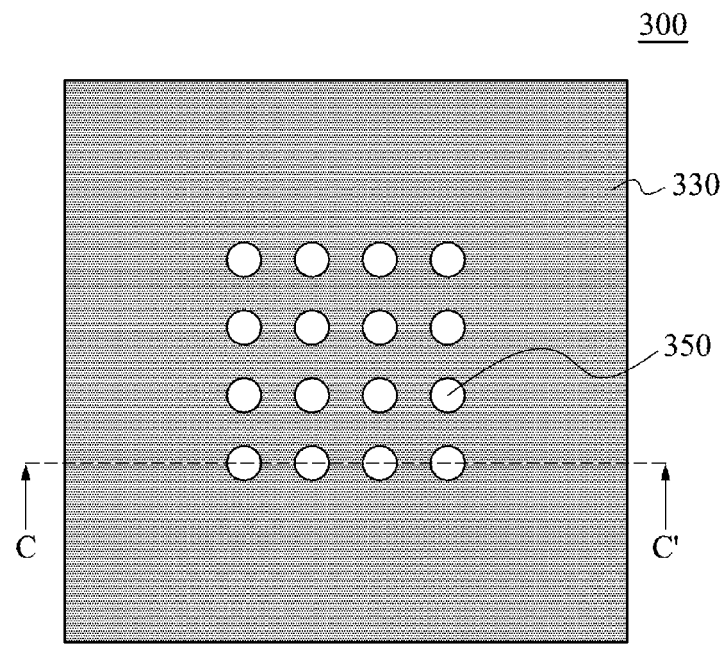
FIG. 5A is a top view schematic of a semiconductor workpiece according to some embodiments of the present disclosure.
Figure 5B:
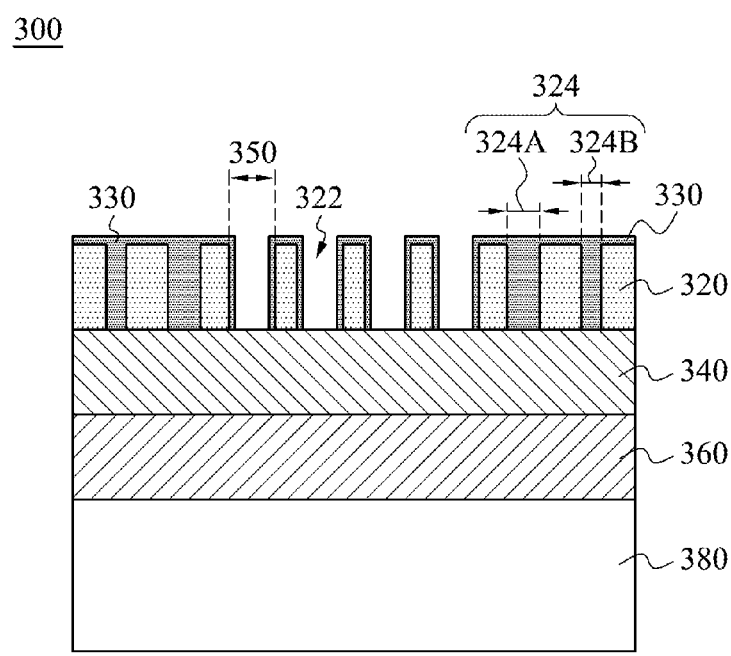
FIG. 5B is a cross-sectional view of a semiconductor workpiece at a stage of a patterns forming method according to some embodiments of the present disclosure.

FIG. 5A and FIG. 5B respectively illustrate a top view schematic and a cross-sectional view of a semiconductor workpiece 300 at a stage of a patterns forming method 100 according to some embodiments, in which FIG. 5B can be regarded as a cross-sectional view of the material 330 taken along line C-C' in FIG. 5A. As shown in FIG. 5A and FIG. 5B, the material 330 is removed from the first main features 322, and forms the second main features 350 within the first main features 322. In some embodiments, the material 330 is partially removed from the first main features 322, to make a through hole within each of the first main features 322, while the dummy features 324 are still sealed by the material 330. The second main features 350 are defined by the through holes. Therefore, the second main features 350 of the photoresist film 320 may be uniform in geometry, so that the photoresist film 320 having the second main features 350 can be used to etch a substrate 360 underneath, for transferring the second main features 350 to form patterned features with a better uniformity on the substrate 360.

It should be noted that, the filling of the material 330, described herein, is only exemplary, and not intended to limit the present disclosure. In other embodiments, the material 330 formed inside the dummy features 324 may be partially removed, while the end of the dummy features 324 remains sealed. In other embodiments, the material 330 may be formed to shrink the size of the first main features 322 and the dummy features 324 until the dummy features 324 are eliminated or blocked by the material 330. It should be understood that, the filling of the material 330 could be adjusted to actual demand by those skilled in the art, without departing from the scope of the present disclosure. The prerequisite of the filling of the material 330 is that the dummy features 324 are eliminated or blocked to form blind holes, and stopped for further transfer.

Referring back to FIG. 5B, in some embodiments, the semiconductor workpiece 300 may further include a hard mask 340 formed between the substrate 360 and the photoresist film 320. Subsequently, the second main features 350 can be transferred onto the hard mask 340 before etching the substrate 360.

Figure 6A:
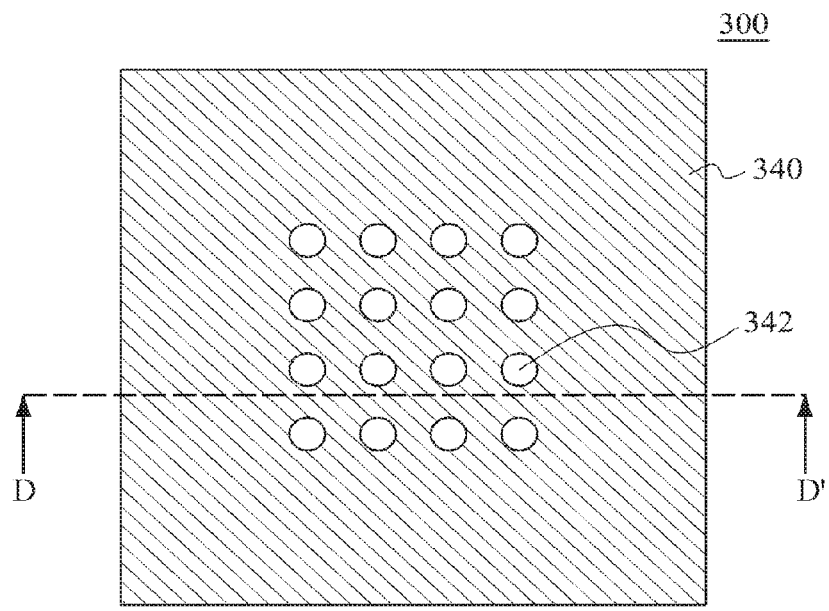
FIG. 6A is a top view schematic of a semiconductor workpiece according to some embodiments of the present disclosure.
Figure 6B:
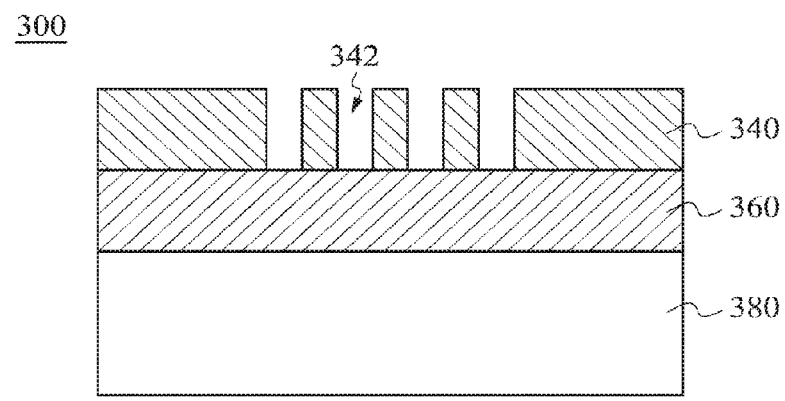
FIG. 6B is a cross-sectional view of a semiconductor workpiece at a stage of a patterns forming method according to some embodiments of the present disclosure.

FIG. 6A and FIG. 6B respectively illustrate a top view schematic and a cross-sectional view of a semiconductor workpiece 300 at a stage of a patterns forming method 100, according to some embodiments, in which FIG. 6B can be regard as a cross-sectional view of the hard mask 340 taken along line D-D' in FIG. 6A. As shown in FIG. 6A and FIG. 6B, the hard mask 340 is etched to form third main features 342 through the second main features 350 of the photoresist film 320 (as shown in FIG. 5B). Subsequently, the photoresist film 320 is removed, to expose the hard mask 340. Owing to the uniformity of the second main features 350, consequently, the third main features 342 correspondingly formed by the second main features 350 may also have inherited the uniformity.

Figure 7:
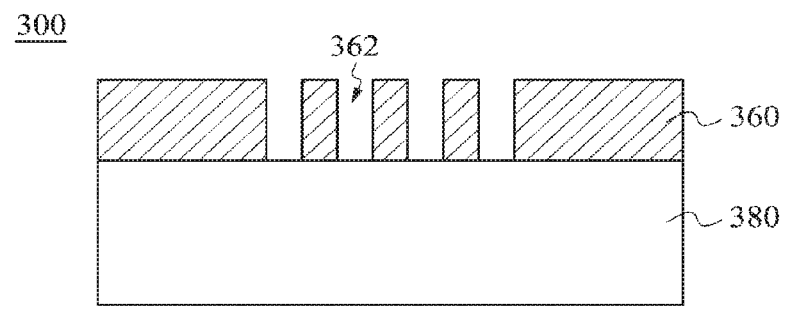
FIG. 7 is a cross-sectional view of a semiconductor workpiece at a stage of a patterns forming method according to some embodiments of the present disclosure.

FIG. 7 illustrates a cross-sectional view of a semiconductor workpiece 300 at a stage of a patterns forming method 100 according to some embodiments. Referring to FIG. 6B and FIG. 7, subsequently in some embodiments, the substrate 360 can be etched through the third main features 342, to form features 362 on the substrate 360, and then the hard mask 340 can be removed to produce a semiconductor workpiece 300 with uniform features 362 formed inside the substrate 360. Therefore, the semiconductor workpiece 300 may have better electrical properties.

Summarized from the above description, the present disclosure provides a patterns forming method including performing a lithography process on a photoresist film with a photomask having first apertures in a first mask region and second apertures in a second mask region to respectively form first main features and dummy features, in which the second mask region is located between the border of the photomask and the first mask region, and a size of each of the first apertures is greater than a size of each of the second apertures; filling a material into the first main features to respectively form second main features, and into the dummy features to seal the dummy features; and etching a substrate by using the photoresist film having the second main features to form patterned features.

Although some embodiments of the present disclosure and their advantages have been described in detail, it should be understood that various changes, substitutions, and alterations can be made herein without departing from the scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the processes, machines, fabrications, composition of matter, means, methods, and steps described in the specification. As one of ordinary skill in the art will readily appreciate from the disclosure of the present disclosure, processes, machines, fabrications, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, fabrications, compositions of matter, means, methods, or steps.

What is claimed is:

1. A patterns forming method comprising:
    performing a lithography process on a photoresist film with a photomask having first apertures in a first mask region and second apertures in a second mask region to form first main features and dummy features, respectively, wherein the second mask region is located between a border of the photomask and the first mask region, and a size of each of the first apertures is greater than a size of each of the second apertures;
    filling a material into the first main features to form second main features and into the dummy features to seal the dummy features; and
    etching a substrate by using the photoresist film having the second main features.

2. The patterns forming method of claim 1, wherein the filling of the material comprises:
    forming the material to fill the first main features and the dummy features of the photoresist film; and
    removing the material to form the second main features within the first main features.

3. The patterns forming method of claim 2, wherein the removing of the material comprises partially removing the material to make a through hole within each of the first main features while the dummy features are still sealed by the material, wherein the second main features are defined by the through holes.

4. The patterns forming method of claim 1, wherein the performing of the lithography process on a photoresist film with the photomask comprises:
    exposing the photoresist film through the photomask; and
    forming the first main features and the dummy features by removing areas of the photoresist film exposed under the first apertures and the second apertures, respectively.

5. The patterns forming method of claim 4, wherein the exposing of the photoresist film through the photomask comprises providing an exposure light having a central region, wherein one or more rows of the second apertures are located between the border of the central region and the first apertures.

6. The patterns forming method of claim 1, further comprising forming a hard mask between the substrate and the photoresist film.

7. The patterns forming method of claim 6, wherein the etching of the substrate further comprises:
    etching the hard mask through the second main features to form third main features; and
    etching the substrate through the third main features.

8. The patterns forming method of claim 1, wherein performing the lithography process on a photoresist film with a photomask having first apertures in a first mask region and second apertures in a second mask region comprises performing the lithography process with the photomask comprising the first mask region surrounded by the second mask region.

9. The patterns forming method of claim 1, wherein performing the lithography process on a photoresist film with a photomask having first apertures in a first mask region and second apertures in a second mask region comprises performing the lithography process with the photomask comprising the first apertures and the second apertures having similar geometry.

10. The patterns forming method of claim 1, further comprising forming the first apertures and the second apertures in a single process.

11. A method of forming patterns on a semiconductor device, comprising:
    exposing a photoresist on a substrate to radiation through a photomask comprising first apertures in a first mask region and second apertures in a second mask region, a size of each of the first apertures greater than a size of each of the second apertures;
    removing portions of the photoresist to form first main features and dummy features in the photoresist;
    forming a material in the first main features and the dummy features to completely fill the first main features and the dummy features;
    removing the material from the first main features to form through holes in the photoresist without removing the material from the dummy features; and
    transferring the through holes to the substrate.

12. The method of claim 11, further comprising transferring the through holes to an underlying material to form through holes in the underlying material.

13. The method of claim 11, wherein transferring the through holes to the substrate comprises forming the through holes in the substrate at uniform minimum feature sizes.

14. The method of claim 11, wherein removing the material from the first main features to form through holes in the photoresist without removing the material from the dummy features comprises forming through holes and blind holes in the photoresist.

15. The method of claim 11, wherein exposing a photoresist on a substrate to radiation through a photomask comprising first apertures in a first mask region and second apertures in a second mask region comprises forming the first apertures and the second apertures comprising square, rectangular, circular, or elliptical geometries.

16. A method of forming patterns on a semiconductor device, comprising:
    exposing a photoresist on a substrate to radiation through a photomask comprising first apertures in a first mask region and second apertures in a second mask region, a size of each of the first apertures greater than a size of each of the second apertures;
    removing portions of the photoresist to form first main features and dummy features in the photoresist;
    forming a resolution enhancement lithography assisted by chemical shrink (RELACS) material or a thermal material in the first main features and the dummy features to fill the first main features and the dummy features;

removing the RELACS material or the thermal material from the first main features to form through holes in the photoresist; and transferring the through holes to the substrate.

17. The method of claim 16, wherein transferring the through holes to the substrate comprises forming uniform holes in the substrate.

\* \* \* \* \*

UNITED STATES PATENT AND TRADEMARK OFFICE
CERTIFICATE OF CORRECTION

PATENT NO. : 9,929,019 B2  
APPLICATION NO. : 15/093734  
DATED : March 27, 2018  
INVENTOR(S) : Kuo-Yao Chou Page 1 of 1

It is certified that error appears in the above-identified patent and that said Letters Patent is hereby corrected as shown below:

On the Title Page

In ITEM (72) Inventor: change "Kuo-Yao Chou, Taichung (TW)" to --Kuo-Yao Chou, Taichung City (TW)--

Signed and Sealed this  
Fourteenth Day of August, 2018

Andrei Iancu  
*Director of the United States Patent and Trademark Office*